US009470720B2

(12) United States Patent
Dean et al.

(10) Patent No.: US 9,470,720 B2
(45) Date of Patent: Oct. 18, 2016

(54) TEST SYSTEM WITH LOCALIZED HEATING AND METHOD OF MANUFACTURE THEREOF

(71) Applicant: SMART Storage Systems, Inc., Chandler, AZ (US)

(72) Inventors: David Lee Dean, Litchfield Park, AZ (US); Robert W. Ellis, Phoenix, AZ (US); Scott Harrow, Scottsdale, AZ (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 151 days.

(21) Appl. No.: 13/791,797

(22) Filed: Mar. 8, 2013

(65) Prior Publication Data

US 2014/0253157 A1    Sep. 11, 2014

(51) Int. Cl.
| | |
|---|---|
| *G01R 31/10* | (2006.01) |
| *G01R 1/44* | (2006.01) |
| *G01R 3/00* | (2006.01) |
| *G01R 31/28* | (2006.01) |
| *G01R 1/04* | (2006.01) |

(52) U.S. Cl.
CPC . *G01R 1/44* (2013.01); *G01R 3/00* (2013.01); *G01R 31/2874* (2013.01); *G01R 1/0458* (2013.01); *Y10T 29/49117* (2015.01)

(58) Field of Classification Search
CPC .......... G01R 31/2874; G01R 31/2891; G01R 1/0458
USPC .............. 324/750.1, 750.11, 750.12, 750.13, 324/750.14
See application file for complete search history.

(56) References Cited

U.S. PATENT DOCUMENTS

| | | | |
|---|---|---|---|
| 4,048,481 A | 9/1977 | Bailey, Jr. et al. | |
| 4,839,587 A | 6/1989 | Flatley et al. | |
| 5,210,680 A | 5/1993 | Scheibler | |
| 5,311,395 A | 5/1994 | McGaha et al. | |
| 5,479,638 A | 12/1995 | Assar et al. | |
| 5,489,805 A * | 2/1996 | Hackitt ................. | H01L 21/565 257/675 |
| 5,628,031 A | 5/1997 | Kikinis et al. | |
| 5,705,850 A * | 1/1998 | Ashiwake ........... | H01L 23/4338 257/706 |
| 5,763,950 A | 6/1998 | Fujisaki et al. | |
| 5,828,549 A | 10/1998 | Gandre et al. | |

(Continued)

FOREIGN PATENT DOCUMENTS

| | | |
|---|---|---|
| CN | 201 655 782 | 11/2010 |
| CN | 102 446 873 | 5/2012 |

(Continued)

OTHER PUBLICATIONS

Ulinktech, "ATA Command Table (in Alphabetic Order)," Feb. 6, 2011, https://web.archive.org/web/20110206060820/http://www.ulinktech.com/downloads/AT , 6 pages.

(Continued)

*Primary Examiner* — Tung X Nguyen
*Assistant Examiner* — Dominic Hawkins
(74) *Attorney, Agent, or Firm* — Morgan, Lewis & Bockius LLP

(57) ABSTRACT

A test system, and a method of manufacture thereof, including: a thermal management head including a heat spreader; an electronic device in direct contact with the heat spreader; and an electrical current for transferring energy between the heat spreader and the electronic device.

18 Claims, 6 Drawing Sheets

(56) References Cited

U.S. PATENT DOCUMENTS

| | | |
|---|---|---|
| 5,923,532 A | 7/1999 | Nedved |
| 5,930,504 A | 7/1999 | Gabel |
| 5,946,190 A | 8/1999 | Patel et al. |
| 5,949,785 A | 9/1999 | Beasley |
| 5,963,983 A | 10/1999 | Sakakura et al. |
| 5,973,920 A | 10/1999 | Altic et al. |
| 6,008,987 A | 12/1999 | Gale et al. |
| 6,009,938 A | 1/2000 | Smith et al. |
| 6,031,730 A | 2/2000 | Kroske |
| 6,058,012 A * | 5/2000 | Cooper ............... G06F 1/203 165/80.3 |
| 6,061,245 A | 5/2000 | Ingraham et al. |
| 6,084,773 A | 7/2000 | Nelson et al. |
| 6,091,652 A | 7/2000 | Haehn et al. |
| 6,275,436 B1 | 8/2001 | Tobita et al. |
| 6,335,862 B1 | 1/2002 | Koya |
| 6,345,367 B1 | 2/2002 | Sinclair |
| 6,356,447 B2 | 3/2002 | Scafidi |
| 6,381,670 B1 | 4/2002 | Lee et al. |
| 6,411,511 B1 | 6/2002 | Chen |
| 6,412,080 B1 | 6/2002 | Fleming et al. |
| 6,507,101 B1 * | 1/2003 | Morris ............... H01L 23/4006 257/659 |
| 6,528,878 B1 * | 3/2003 | Daikoku ............. H01L 23/10 257/714 |
| 6,529,997 B1 | 3/2003 | Debiez et al. |
| 6,541,310 B1 * | 4/2003 | Lo ..................... H01L 21/561 257/706 |
| 6,552,581 B1 | 4/2003 | Gabara |
| 6,570,762 B2 | 5/2003 | Cross et al. |
| 6,587,915 B1 | 7/2003 | Kim |
| 6,618,249 B2 | 9/2003 | Fairchild |
| 6,621,705 B1 | 9/2003 | Ballenger et al. |
| 6,728,913 B1 | 4/2004 | Parker |
| 6,762,942 B1 | 7/2004 | Smith |
| 6,763,424 B2 | 7/2004 | Conley |
| 6,775,792 B2 | 8/2004 | Ulrich et al. |
| 6,778,387 B2 | 8/2004 | Fairchild |
| 6,850,443 B2 | 2/2005 | Lofgren et al. |
| 6,854,070 B2 | 2/2005 | Johnson et al. |
| 6,892,801 B1 * | 5/2005 | Kim ................... F28D 15/0275 165/104.21 |
| 6,903,972 B2 | 6/2005 | Lasser et al. |
| 6,906,961 B2 | 6/2005 | Eggleston et al. |
| 6,934,152 B1 | 8/2005 | Barrow |
| 6,975,028 B1 | 12/2005 | Wayburn et al. |
| 6,997,720 B2 | 2/2006 | Perret et al. |
| 7,030,482 B2 | 4/2006 | Haines |
| 7,075,788 B2 | 7/2006 | Larson et al. |
| 7,079,972 B1 * | 7/2006 | Wood ................. G06F 1/206 257/E23.08 |
| 7,082,495 B2 | 7/2006 | DeWhitt et al. |
| 7,107,389 B2 | 9/2006 | Inagaki et al. |
| 7,139,864 B2 | 11/2006 | Bennett et al. |
| 7,233,497 B2 | 6/2007 | Simon et al. |
| 7,233,501 B1 | 6/2007 | Ingalz |
| 7,243,186 B2 | 7/2007 | Liang et al. |
| 7,280,364 B2 | 10/2007 | Harris et al. |
| 7,330,927 B1 | 2/2008 | Reeve et al. |
| 7,333,364 B2 | 2/2008 | Yu et al. |
| 7,350,101 B1 | 3/2008 | Nguyen et al. |
| 7,355,896 B2 | 4/2008 | Li et al. |
| 7,434,122 B2 | 10/2008 | Jo |
| 7,441,067 B2 | 10/2008 | Gorobets et al. |
| 7,474,528 B1 | 1/2009 | Olesiewicz |
| 7,480,147 B2 | 1/2009 | Hoss et al. |
| 7,516,267 B2 | 4/2009 | Coulson et al. |
| 7,595,994 B1 | 9/2009 | Sun |
| 7,599,182 B2 | 10/2009 | Sun |
| 7,613,871 B2 | 11/2009 | Tanaka et al. |
| 7,620,769 B2 | 11/2009 | Lee et al. |
| 7,623,343 B2 | 11/2009 | Chen |
| 7,639,532 B2 | 12/2009 | Roohparvar et al. |
| 7,661,054 B2 | 2/2010 | Huffman et al. |
| 7,679,948 B2 | 3/2010 | Park et al. |
| 7,738,502 B2 | 6/2010 | Chang et al. |
| 7,743,216 B2 | 6/2010 | Lubbers et al. |
| 7,818,525 B1 | 10/2010 | Frost et al. |
| 7,827,348 B2 | 11/2010 | Lee et al. |
| 7,830,164 B2 | 11/2010 | Earle et al. |
| 7,959,445 B1 | 6/2011 | Daily et al. |
| 7,961,462 B2 | 6/2011 | Hernon |
| 7,979,614 B1 | 7/2011 | Yang |
| 7,980,863 B1 | 7/2011 | Holec et al. |
| 7,989,709 B2 | 8/2011 | Tsao |
| 8,000,096 B2 | 8/2011 | Nemoz et al. |
| 8,000,135 B1 | 8/2011 | Perlmutter et al. |
| 8,010,738 B1 | 8/2011 | Chilton et al. |
| 8,028,123 B2 | 9/2011 | Kilzer et al. |
| 8,046,645 B2 | 10/2011 | Hsu et al. |
| 8,051,241 B2 | 11/2011 | Feldman et al. |
| 8,072,805 B2 | 12/2011 | Chou et al. |
| 8,095,724 B2 | 1/2012 | Ji et al. |
| 8,095,765 B2 | 1/2012 | Asnaashari et al. |
| 8,117,396 B1 | 2/2012 | Fair et al. |
| 8,127,202 B2 | 2/2012 | Cornwell et al. |
| 8,145,984 B2 | 3/2012 | Sommer et al. |
| 8,154,921 B2 | 4/2012 | Mokhlesi et al. |
| 8,169,825 B1 | 5/2012 | Shalvi et al. |
| 8,198,539 B2 * | 6/2012 | Otoshi ............... H01L 23/367 165/104.33 |
| 8,208,252 B2 | 6/2012 | Tolliver |
| 8,219,724 B1 | 7/2012 | Caruso et al. |
| 8,219,776 B2 | 7/2012 | Forhan et al. |
| 8,228,701 B2 | 7/2012 | Sokolov et al. |
| 8,245,101 B2 | 8/2012 | Olbrich et al. |
| 8,254,172 B1 | 8/2012 | Kan |
| 8,259,506 B1 | 9/2012 | Sommer et al. |
| 8,289,801 B2 | 10/2012 | Smith et al. |
| 8,305,103 B2 | 11/2012 | Kang et al. |
| 8,332,578 B2 | 12/2012 | Frickey, III et al. |
| 8,363,413 B2 | 1/2013 | Paquette et al. |
| 8,369,141 B2 | 2/2013 | Sommer et al. |
| 8,373,986 B2 | 2/2013 | Sun |
| 8,386,700 B2 | 2/2013 | Olbrich et al. |
| 8,405,985 B1 | 3/2013 | Reynov et al. |
| 8,407,409 B2 | 3/2013 | Kawaguchi |
| 8,464,106 B2 | 6/2013 | Filor et al. |
| 8,472,183 B1 | 6/2013 | Ross et al. |
| 8,477,495 B2 | 7/2013 | Sun et al. |
| 8,570,740 B2 | 10/2013 | Cong et al. |
| 8,599,560 B2 | 12/2013 | Wu et al. |
| 8,612,804 B1 | 12/2013 | Kang et al. |
| 9,089,073 B2 | 7/2015 | Reynov et al. |
| 2002/0008963 A1 | 1/2002 | DiBene, II et al. |
| 2002/0076951 A1 | 6/2002 | Roy |
| 2002/0123259 A1 | 9/2002 | Yatskov et al. |
| 2002/0159285 A1 | 10/2002 | Morley et al. |
| 2003/0046603 A1 | 3/2003 | Harari et al. |
| 2003/0074592 A1 | 4/2003 | Hasegawa |
| 2003/0163633 A1 | 8/2003 | Aasheim et al. |
| 2003/0184970 A1 | 10/2003 | Bosch et al. |
| 2004/0080985 A1 | 4/2004 | Chang et al. |
| 2004/0218367 A1 | 11/2004 | Lin et al. |
| 2004/0246662 A1 | 12/2004 | Thurk et al. |
| 2004/0252670 A1 | 12/2004 | Rong et al. |
| 2005/0009382 A1 | 1/2005 | Burmeister et al. |
| 2005/0013120 A1 | 1/2005 | Liu |
| 2005/0021904 A1 | 1/2005 | Iaculo et al. |
| 2005/0038792 A1 | 2/2005 | Johnson |
| 2005/0073884 A1 | 4/2005 | Gonzalez et al. |
| 2005/0082663 A1 | 4/2005 | Wakiyama et al. |
| 2005/0152112 A1 | 7/2005 | Holmes et al. |
| 2006/0020745 A1 | 1/2006 | Conley et al. |
| 2006/0042291 A1 | 3/2006 | Petroski |
| 2006/0067066 A1 | 3/2006 | Meier et al. |
| 2006/0133041 A1 | 6/2006 | Belady et al. |
| 2006/0136682 A1 | 6/2006 | Haridas et al. |
| 2006/0143365 A1 | 6/2006 | Kikuchi |
| 2006/0253641 A1 | 11/2006 | Gatzemeier et al. |
| 2006/0256624 A1 | 11/2006 | Eggleston et al. |
| 2006/0282644 A1 | 12/2006 | Wong |
| 2006/0294574 A1 | 12/2006 | Cha |
| 2007/0001282 A1 | 1/2007 | Kang et al. |

(56) References Cited

U.S. PATENT DOCUMENTS

| | | |
|---|---|---|
| 2007/0057686 A1 | 3/2007 | Suga et al. |
| 2007/0061511 A1 | 3/2007 | Faber |
| 2007/0074850 A1 | 4/2007 | Peschl |
| 2007/0083779 A1 | 4/2007 | Misaka et al. |
| 2007/0097653 A1 | 5/2007 | Gilliland et al. |
| 2007/0121297 A1 | 5/2007 | Uchizono et al. |
| 2007/0145996 A1 | 6/2007 | Shiao et al. |
| 2007/0211426 A1 | 9/2007 | Clayton et al. |
| 2007/0211436 A1 | 9/2007 | Robinson et al. |
| 2007/0216005 A1* | 9/2007 | Yim ............... H01L 23/3128 257/686 |
| 2007/0216009 A1* | 9/2007 | Ng .................. H01L 23/055 257/690 |
| 2007/0230111 A1 | 10/2007 | Starr et al. |
| 2007/0234004 A1 | 10/2007 | Oshima et al. |
| 2007/0246189 A1 | 10/2007 | Lin et al. |
| 2007/0247805 A1 | 10/2007 | Fujie et al. |
| 2007/0260811 A1 | 11/2007 | Merry, Jr. et al. |
| 2007/0263444 A1 | 11/2007 | Gorobets et al. |
| 2007/0276973 A1 | 11/2007 | Tan et al. |
| 2008/0019095 A1 | 1/2008 | Liu |
| 2008/0026637 A1 | 1/2008 | Minich |
| 2008/0043435 A1 | 2/2008 | Yip et al. |
| 2008/0046630 A1 | 2/2008 | Lasser |
| 2008/0052435 A1 | 2/2008 | Norwood et al. |
| 2008/0052446 A1 | 2/2008 | Lasser et al. |
| 2008/0068796 A1 | 3/2008 | Pav et al. |
| 2008/0082736 A1 | 4/2008 | Chow et al. |
| 2008/0116571 A1 | 5/2008 | Dang et al. |
| 2008/0158818 A1 | 7/2008 | Clidaras et al. |
| 2008/0183918 A1 | 7/2008 | Dhokia et al. |
| 2008/0236791 A1 | 10/2008 | Wayman |
| 2008/0252324 A1 | 10/2008 | Barabi et al. |
| 2008/0254573 A1* | 10/2008 | Sir .................. H01L 23/04 438/122 |
| 2008/0266807 A1 | 10/2008 | Lakin et al. |
| 2008/0291636 A1 | 11/2008 | Mori et al. |
| 2008/0313505 A1 | 12/2008 | Lee et al. |
| 2009/0019321 A1 | 1/2009 | Radke |
| 2009/0083587 A1 | 3/2009 | Ng et al. |
| 2009/0089485 A1 | 4/2009 | Yeh |
| 2009/0138654 A1 | 5/2009 | Sutardja |
| 2009/0146721 A1 | 6/2009 | Kurooka et al. |
| 2009/0157948 A1 | 6/2009 | Trichina et al. |
| 2009/0164702 A1 | 6/2009 | Kern |
| 2009/0172262 A1 | 7/2009 | Olbrich et al. |
| 2009/0190308 A1 | 7/2009 | Bhattacharya et al. |
| 2009/0228761 A1 | 9/2009 | Perlmutter et al. |
| 2009/0259819 A1 | 10/2009 | Chen et al. |
| 2009/0259896 A1 | 10/2009 | Hsu et al. |
| 2009/0273898 A1 | 11/2009 | Imsand |
| 2009/0302458 A1 | 12/2009 | Kubo et al. |
| 2009/0309214 A1 | 12/2009 | Szewerenko et al. |
| 2009/0323419 A1 | 12/2009 | Lee et al. |
| 2009/0327581 A1 | 12/2009 | Coulson |
| 2009/0327591 A1 | 12/2009 | Moshayedi |
| 2010/0008034 A1 | 1/2010 | Hinkle |
| 2010/0017650 A1 | 1/2010 | Chin et al. |
| 2010/0023674 A1 | 1/2010 | Aviles |
| 2010/0050053 A1 | 2/2010 | Wilson et al. |
| 2010/0073860 A1 | 3/2010 | Moriai et al. |
| 2010/0073880 A1 | 3/2010 | Liu |
| 2010/0091463 A1 | 4/2010 | Buresch et al. |
| 2010/0118496 A1 | 5/2010 | Lo |
| 2010/0138592 A1 | 6/2010 | Cheon |
| 2010/0164525 A1* | 7/2010 | Han ................. G01R 1/0458 324/756.02 |
| 2010/0169541 A1 | 7/2010 | Freikorn |
| 2010/0174845 A1 | 7/2010 | Gorobets et al. |
| 2010/0217898 A1 | 8/2010 | Priborsky et al. |
| 2010/0217915 A1 | 8/2010 | O'Connor et al. |
| 2010/0224985 A1* | 9/2010 | Michael et al. .............. 257/692 |
| 2010/0228928 A1 | 9/2010 | Asnaashari et al. |
| 2010/0262792 A1 | 10/2010 | Hetzler et al. |
| 2010/0262795 A1 | 10/2010 | Hetzler et al. |
| 2010/0262875 A1 | 10/2010 | Hetzler et al. |
| 2010/0287328 A1 | 11/2010 | Feldman et al. |
| 2010/0293367 A1 | 11/2010 | Berke et al. |
| 2010/0296255 A1 | 11/2010 | Maloney |
| 2010/0312954 A1 | 12/2010 | Jeon et al. |
| 2010/0318719 A1 | 12/2010 | Keays et al. |
| 2010/0319986 A1 | 12/2010 | Bleau et al. |
| 2010/0328887 A1 | 12/2010 | Refai-Ahmed et al. |
| 2010/0332726 A1 | 12/2010 | Wang |
| 2011/0055468 A1 | 3/2011 | Gonzalez et al. |
| 2011/0066788 A1 | 3/2011 | Eleftheriou et al. |
| 2011/0131365 A1 | 6/2011 | Zhang et al. |
| 2011/0131447 A1 | 6/2011 | Prakash et al. |
| 2011/0132000 A1* | 6/2011 | Deane ............... F25B 21/04 62/3.3 |
| 2011/0145473 A1 | 6/2011 | Maheshwari |
| 2011/0182035 A1 | 7/2011 | Yajima |
| 2011/0188205 A1 | 8/2011 | MacManus et al. |
| 2011/0190963 A1 | 8/2011 | Glassl et al. |
| 2011/0191522 A1 | 8/2011 | Condict et al. |
| 2011/0191649 A1 | 8/2011 | Lim et al. |
| 2011/0238892 A1 | 9/2011 | Tsai et al. |
| 2011/0299244 A1 | 12/2011 | Dede et al. |
| 2011/0317359 A1 | 12/2011 | Wei et al. |
| 2011/0320687 A1 | 12/2011 | Belluomini et al. |
| 2012/0014067 A1 | 1/2012 | Siracki |
| 2012/0047320 A1 | 2/2012 | Yoo et al. |
| 2012/0047409 A1 | 2/2012 | Post et al. |
| 2012/0064781 A1 | 3/2012 | Krishnan et al. |
| 2012/0124046 A1 | 5/2012 | Provenzano |
| 2012/0124273 A1 | 5/2012 | Goss et al. |
| 2012/0151260 A1 | 6/2012 | Zimmermann et al. |
| 2012/0170224 A1 | 7/2012 | Fowler et al. |
| 2012/0201007 A1 | 8/2012 | Yeh et al. |
| 2012/0216085 A1 | 8/2012 | Weingarten et al. |
| 2012/0239858 A1 | 9/2012 | Melik-Martirosian |
| 2012/0266048 A1 | 10/2012 | Chung et al. |
| 2012/0293962 A1 | 11/2012 | McCluskey et al. |
| 2012/0327598 A1 | 12/2012 | Nakayama |
| 2012/0331207 A1 | 12/2012 | Lassa et al. |
| 2013/0007380 A1 | 1/2013 | Seekins et al. |
| 2013/0007543 A1 | 1/2013 | Goss et al. |
| 2013/0073788 A1 | 3/2013 | Post et al. |
| 2013/0080691 A1 | 3/2013 | Weingarten et al. |
| 2013/0100600 A1 | 4/2013 | Yin et al. |
| 2013/0124792 A1 | 5/2013 | Melik-Martirosian et al. |
| 2013/0155800 A1 | 6/2013 | Shim et al. |
| 2013/0181733 A1* | 7/2013 | Kikuchi ............ G01R 1/0466 324/750.03 |
| 2013/0285686 A1 | 10/2013 | Malik et al. |
| 2013/0294028 A1 | 11/2013 | Lafont et al. |
| 2013/0307060 A1* | 11/2013 | Wang ............... H01L 29/42372 257/330 |
| 2014/0055944 A1 | 2/2014 | McCabe et al. |
| 2014/0071614 A1* | 3/2014 | Kaldani ............ H05K 7/20 361/679.46 |
| 2014/0108891 A1 | 4/2014 | Strasser et al. |
| 2014/0153181 A1 | 6/2014 | Peng et al. |
| 2014/0182814 A1 | 7/2014 | Lin |

FOREIGN PATENT DOCUMENTS

| | | |
|---|---|---|
| DE | 199 10 500 A1 | 10/2000 |
| DE | 2005 063281 | 7/2007 |
| EP | 0 600 590 A1 | 6/1994 |
| EP | 0 989 794 A2 | 3/2000 |
| EP | 1 990 921 A2 | 11/2008 |
| EP | 2 066 158 A2 | 6/2009 |
| EP | 2 395 827 A2 | 12/2011 |
| EP | 2 600 700 A1 | 6/2013 |
| FR | 2560731 | 9/1985 |
| JP | 06006064 | 1/1994 |
| JP | 2003 188565 | 7/2003 |
| WO | WO 88 07193 | 3/1988 |
| WO | WO 03/094586 A1 | 11/2003 |
| WO | WO 2004/086827 A2 | 10/2004 |
| WO | WO 2008/013850 A2 | 1/2008 |

(56) References Cited

FOREIGN PATENT DOCUMENTS

| WO | WO 2009/042298 A1 | 4/2009 |
|---|---|---|
| WO | WO 2013/080341 | 6/2013 |

OTHER PUBLICATIONS

International Search Report dated Mar. 25, 2014, received in International Patent Application No. PCT/US2013/072400, which corresponds to U.S. Appl. No. 13/690,337, 3 pages (Ellis).

Invitation to Pay Additional Fees dated Jul. 25, 2014, received in International Patent Application No. PCT/US2014/021290, which corresponds to U.S. Appl. No. 13/791,797, 8 pages (Dean).

International Search Report and Written Opinion dated Jul. 31 2014, received in International Patent Application No. PCT/US2014/031465, which corresponds to U.S. Appl. No. 13/851,928, 13 pages (Ellis).

International Search Report and Written Opinion dated Jul. 31, 2014, received in International Patent Application No. PCT/US2014/033876, which corresponds to U.S. Appl. No. 13/861,326, 9 pages (Fitzpatrick).

International Search Report and Written Opinion dated Dec. 16, 2014, received in International Patent Application No. PCT/US2014/059114, which corresponds to U.S. Appl. No. 14/135,223, 9 pages (Dean).

International Search Report and Written Opinion dated Nov. 20, 2014, received in International Patent Application No. PCT/US2014/020290, which corresponds to U.S. Appl. No. 13/791,797, 21 pages (Dean).

International Search Report and Written Opinion dated Dec. 23, 2014, received in International Patent Application No. PCT/US2014/042772, which corresponds to U.S. Appl. No. 13/922,105, 10 pages (Deans).

International Search Report and Written Opinion dated Sep. 12, 2014, received in International Patent Application No. PCT/US2014/043146.

Cooke, "Introduction to Flash Memory (T1A)," Flash Memory Summit, Aug. 22, 2008, Micron Technology, Inc., 102 pages.

Gal et al., "Algorithms and Data Structures for Flash Memories," ACM Computing Surveys, Jun. 2005, vol. 37, No. 2, 30 pages.

IBM Corporation, "Systems Management, Work Management," Version 5, Release 4, 9th Edition, Feb. 2006, pp. 1-21.

O'Brien, "SMART Storage Systems Optimus SAS Enterprise SSD Review," SMART Storage Systems, Oct. 9, 2012, 44 pages.

Spanjer, "Flash Management—Why and How?" Smart Modular Technologies, Nov. 2009, http://www.scantec.de/fileadmin/pdf/Smart_Modular/Flash-Management.pdf, 14 pages.

Texas Instruments, "Power Management IC for Digital Set Top Boxes," SLVSA10A, Sep. 2009, pp. 1-22.

International Search Report and Written Opinion dated Dec. 20, 2013, received in PCT/US2013/045282, which corresponds to U.S. Appl. No. 13/493,949, 7 pages (Ellis).

International Search Report and Written Opinion dated Jun. 12, 2014, received in PCT/US2014/018972, which corresponds to U.S. Appl. No. 13/779,352, 12 pages (Schmier).

International Search Report and Written Opinion dated May 14, 2014, received in International Patent Application No. PCT/US2014/017168, which corresponds to U.S. Appl. No. 13/076,115, 6 pages (Fitzpatrick).

International Search Report and Written Opinion dated May 14, 2014, received in International Patent Application No. PCT/US2014/017169, which corresponds to U.S. Appl. No. 14/076,148, 6 pages (Fitzpatrick).

International Search Report and Written Opinion dated Apr. 28, 2015 received in International Patent Application No. PCT/US2015/014563, which corresponds to U.S. Appl. No. 14/179,247, 9 pages (Ellis).

International Search Report and Written Opinion dated May 8, 2015, received in Internationai Patent Application No. PCT/US2015/017722, which corresponds to U.S. Appl. No. 14/277,716, 9 pages (Dean).

International Search Report and Written Opinion dated May 13, 2015, received in International Patent Application No. PCT/US2015/017724, which corresponds to U.S. Appl. No 14/244,734, 12 pages, (Dean).

International Search Report and Written Opinion dated May 18, 2015, received in International Patent Application No. PCT/US2015/016656, which corresponds to U.S. Appl. No. 14/275,690, 14 pages (Wright).

International Search Report and Written Opinion dated May 28, 2015, received in International Patent Application No. PCT/US2015/017729, which corresponds to U.S. Appl. No. 14/244,745, 14 pages (Ellis).

* cited by examiner

TEST SYSTEM WITH LOCALIZED HEATING AND METHOD OF MANUFACTURE THEREOF

TECHNICAL FIELD

The present invention relates generally to a test system, and more particularly to a system for localized heating of a test system.

BACKGROUND ART

Integrated circuits and integrated circuit systems can be found in a multitude of electronic devices, such as smart phones, digital cameras, location based devices, portable music players, printers, computers, etc. Some of the many challenges faced by the integrated circuit industry in producing these integrated circuits include designing faster, more reliable, and higher-density circuits at a lower cost.

During operation, these integrated circuits can be exposed to extreme temperature environments and/or generate their own undesirable heat profile that can interfere with the operation of the device itself and/or proximately located integrated circuits. Unfortunately, as modern consumer electronics continue to shrink and operate at continually increasing frequencies, the heat generated by these devices continues to increase as well.

Typically, before an integrated circuit reaches a customer, the integrated circuit manufacturer conducts a series of tests to verify that the integrated circuit operates according to some specification. Accordingly, the electronics industry has developed operational testing procedures to evaluate the structural integrity and heat tolerance of these circuits. Generally, in order to perform operational testing in integrated circuits, the DUT (Device Under Test) can be exercised through a range of temperatures. The larger the temperature range, the more useful the testing becomes. For flash type integrated circuits, higher temperatures (>85° C.) accelerate device test time and wear to prove endurance and retention algorithms. For ASICs, higher temperatures can either test a device to determine if it can operate at a temperature higher than specified (i.e., for industrial and/or defense applications) or determine the device's operating margin.

Unfortunately, a problem arises when taking the device tester through these extreme temperature profiles (e.g., greater than 80° C. ambient), as permanent damage to the tester itself can occur. Typical test systems can include environmental chambers, which house the entire test fixture, forced air systems with a custom hood, or automatic test equipment (ATE) with special ovens and heating fixtures.

Environmental chambers are costly options that consume large amounts of bench space and electricity. Environmental chambers also suffer from significant temperature variation between the PID (Proportional-Integral-Derivative) loop thermocouple and the DUT case temperature. Additionally, the maximum temperature of this system is limited to the maximum operating temperature of the tester components (typically 70° C. to 85° C.). Furthermore, the ramp rate of an environmental chamber is usually limited to avoid damage to the solder connections.

Forced-air systems share similar issues with environmental chambers while also possessing the additional burden of greater expense, complicated hoods, and substantial operating costs due to clean, dry air requirements. Moreover, a typical forced-air setup usually manages only four (4) devices depending on the air supply.

Although, ATE systems can be used for high temperature testing, ATE systems are extremely expensive and generally only accommodate between one (1) to four (4) devices at a time and are not intended for extended duration tests.

Thus, a need still remains for a reliable test system and method of fabrication, wherein the test system provides a cost effective high temperature testing procedure for electronic devices. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of a test system including: providing a thermal management head including a heat spreader; placing the heat spreader in direct contact with an electronic device; and transferring energy between the heat spreader and the electronic device by altering an electrical current.

The present invention provides a test system, including: a thermal management head including a heat spreader; an electronic device in direct contact with the heat spreader; and an electrical current for transferring energy between the heat spreader and the electronic device.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1A:
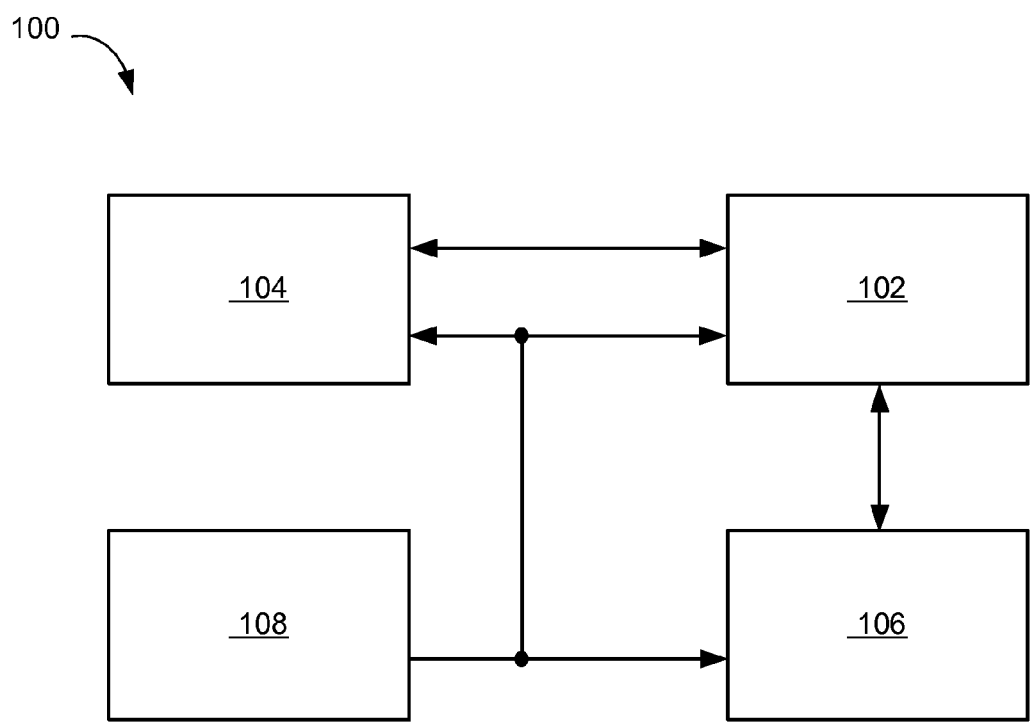
FIG. 1A is a system block diagram of a test system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention.

However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the medium upon which the test system is placed, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements.

The term "processing" as used herein includes deposition of material or photoresist, patterning, exposure, development, etching, cleaning, and/or removal of the material or photoresist as required in forming a described structure.

The terms "example" or "exemplary" are used herein to mean serving as an instance or illustration. Any aspect or embodiment described herein as an "example" or as "exemplary" is not necessarily to be construed as preferred or advantageous over other aspects or designs.

The terms "first" and "second" as used herein are for purposes of differentiation between elements and/or embodiments only and are not to be construed as limiting the scope of the present invention.

Objects described herein as being "adjacent" each other may be in close proximity to each other, e.g., separated only by the minimum distance required by the current technology node, or in the same general region or area as each other, as appropriate for the context in which the phrase is used.

Generally, the test system and its constituent components described herein can operate together to provide localized heating and cooling of an electronic structure to induce thermal fatigue. In such cases, the test system described herein can replace a conventional oven by providing spot heating/cooling to parts of an integrated circuit, circuit board, or electrical system so the testing of electrical components and systems can be accelerated; e.g., ten years of lifetime usage can be compressed into one hundred hours of testing because the devices or parts of it are heated to the extreme of their operating range to age the devices.

In at least one embodiment, the test system and its constituent components heat a drive by conduction. Normally, an SSD (Solid State Drive) will stop working when heated past a given temperature, so it is not advisable to heat the entire drive for high temperature testing. Instead, the present embodiments heat a heat spreader that can be custom made to clamp onto the electronic structure on both sides of a PCB (Printed Circuit Board). As such, the other drive level components do not experience the high temperatures thereby saving them from failure. Thermal elements, under a PID controller, are fastened with thermal and mechanical interfaces to the heat spreader to bring all the drive's targeted electronic devices to the appropriate temperature. Cooling holes can also be designed into the heat spreader for either forced air cooling, under PID control, or by convection. Additionally, a Peltier cooler can be thermally connected to the test system to implement heating and/or cooling under PID control.

In at least one embodiment, the test system described herein can produce as much as a 50° C. difference in temperature between the DUT and the PCB by attaching a single thermal management head to provide spot heating and cooling over a range of about 0-125° C. with a heating rate in excess of 7° C. per minute.

In general, by using a heat spreader, it is possible to heat test selective chips on a PCB as well as provide a heating gradient on a single chip to allow different parts of a package chip to be tested. For example, the CPU (Central Processing Unit) could be tested separately from the cache to simulate the hot spots that develop on integrated circuit chips such as microprocessors. Therefore, in addition to being able to test different areas of a PCB with different temperatures, it is also possible to achieve gradient temperature profiles within an individual integrated circuit. All this can be accomplished while keeping the controller in an ambient environment. In addition, the present invention requires the use of less energy because the energy is being applied selectively for heating and cooling into very small areas established by the size of the heat spreader.

Referring now to FIG. 1A, therein is shown a system block diagram of a test system 100 in an embodiment of the present invention. The test system 100 can include a localized heater and a thermal management head 102. The system block diagram depicts the localized heater's electrical operation and its interfaces to the thermal management head 102, which will be described in more details in FIG. 4.

This drawing is a depiction of a localized heating system shown as major components including an oven or the thermal management head 102 as an example of an embodiment of the invention and a control unit 104. The oven is shown as an exploded view and with its interfaces to the control unit 104. The control unit 104 is shown with its front and back panels, which include oven and user interfaces. Also included is a portion of a test platform that includes DUTs to show one of intended applications of the localized heater.

The test system 100 can include a PID controller (not shown) in the control unit 104, a temperature indicator (not shown) in an indicator unit 106, and their related electrical circuits to monitor and control the localized heater. The PID controller can include interfaces to support the operation of a control network, thermocouple/sensor interface and a solid state relay interface. The PID controller can be electrically connected to other components in the control unit 104 including RJ45 jacks (not shown), a solid state relay (not shown), a protective fuse (not shown), a heater jack (not shown), and thermocouple jacks (not shown).

The RJ45 jacks are intended to connect the PID controller to a network including an RS485 network. The PID controller can be operated by a front panel (not shown) of a device including the PID controller or remotely using the RJ45 jacks connected to a host computer (not shown)

external to the control unit 104. The solid state relay interfaces with the PID controller to provide a heating element (not shown), in the thermal management head 102, with power in a precise controlled manner. The protective fuse can be added for safety.

The PID controller can also include inputs from a temperature sensor (not shown), in the thermal management head 102, to complete a control loop. These can be connected using the thermocouple jacks. It will be appreciated by those skilled in the art that in at least one embodiment, thermocouple connections from the temperature sensor to the PID controller be the same metals as used in a thermocouple or the temperature sensor itself.

The heater jack provides a modulated power to operate a heater or the heating element and a neon lamp indicator (not shown), in the thermal management head 102. It will be appreciated by those skilled in the art that in at least one embodiment, a series resistor can be connected to the neon lamp indicator. The control loop including a PID control loop can be closed by the heater being attached to a heat slug (not shown), in the thermal management head 102. The heat slug can include the thermocouple embedded in or attached to the heat slug.

The temperature indicator and its related electrical circuits can be added to the controller or the indicator unit 106 for safety and redundant temperature monitoring. The temperature indicator can include interfaces to support a 24-volt (24V) supply to operate an external circuitry, a thermocouple or sensor interface, and a normally open switch contact for, when closed, indicating an alarm condition as detected by the temperature indicator.

Programming the temperature indicator can enable the detection of an alarm condition as required by the user. Once the alarm condition is detected by the temperature indicator, it can activate the appropriate portion of a latching relay (not shown) in the indicator unit 106. The latching relay in turn can disconnect power to the PID controller. Once power is removed from the PID controller, there can be no power to heating/cooling elements thereby preventing equipment damage.

Circuits associated with the temperature indicator can be included in the indicator unit 106. A first light-emitting diode (LED) (not shown), in the indicator unit 106, can visually indicate that the controller is operating normally. For example, the first LED can be a green LED. A resistor/diode pair (not shown), in the indicator unit 106, can be included to suppress inductive kickback that occurs when operating the latching relay including a dual latching relay, which indicates one of two states—normal and alarm.

A resistor/diode pair (not shown), in the indicator unit 106, can suppress inductive kickback on the other coil from the latching relay. A second LED (not shown), in the indicator unit 106, is a visual indicator that indicates an alarm condition. For example, the second LED can be a red LED.

A buzzer (not shown), in the indicator unit 106, is an audible indicator of an alarm condition. For example, the buzzer can be a Peizo buzzer. A third LED (not shown), in the indicator unit 106, is a visual indicator to show if the buzzer is enabled. For example, the third LED can be an amber LED.

A first switch (not shown), in the indicator unit 106, allows the user to enable or disable an audible alarm or the buzzer. If the audible alarm is disabled, then the first switch can power the third LED to show that the audible alarm is disabled. A second switch (not shown), in the indicator unit 106, can be operated by the user to reset an alarm condition detected by the temperature indicator. The alarm condition cannot be cleared if an alarm event detected by the temperature indicator has not been resolved.

The temperature indicator can include a sensor input. The sensor and related wiring can include a second thermocouple jack (not shown), in the indicator unit 106, and a thermocouple plug (not shown) and a second temperature sensor or thermocouple (not shown), both in the indicator unit 106. The test system 100 can include a power unit 108, which is a power system that includes a switched power entry module, a protection fuse, and a power filter for purposes of supplying an alternating current (AC) power to the entire system.

Figure 1B:
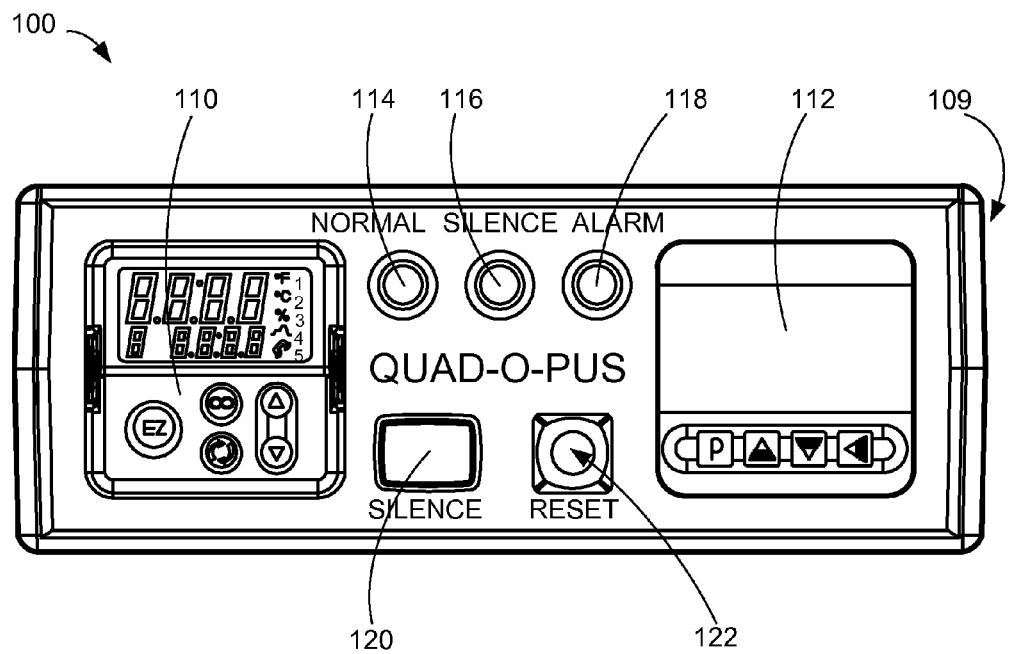
FIG. 1B is an exemplary view of a front panel of the test system.

Referring now to FIG. 1B, therein is shown an exemplary view of a front panel 109 of the test system 100. FIG. 1B depicts the exemplary view in at least one embodiment at the system level. The front panel 109 is the front panel previously described.

The test system 100 can include a localized heater oven (not shown) having components to directly heat electrical components to a high temperature. For example, two localized heater ovens can be mounted to a printed circuit board (PCB) (not shown). The localized heater ovens can house the DUTs. The circuit board can then be mounted to a test fixture (not shown). The localized heater oven can be connected to a localized heater control box back panel (not shown). Electrical interfaces (not shown) can be provided in the test system 100 from the localized heater oven to the back panel.

The localized heater oven's main components can include a nichrome strip heater (not shown), thermal interfaces (not shown), a heat slug (not shown) to direct heat to the DUT in the PCB, an indicator lamp (not shown), and the electrical interfaces. The electrical interfaces are that of thermocouples that are connected to the thermocouple jacks on the localized heater control box back panel. One of the electrical interfaces can be connected to a power jack or a power outlet on the controller back panel.

One of the thermocouples from the localized heater oven can be connected to a PID loop controller 110 via one of back panel connectors (not shown). The PID loop controller 110 is the PID controller previously described. The other thermocouple can be connected to a temperature indicator 112 via one of the back panel connectors. Either thermocouple can be connected to either the PID loop controller 110 or the temperature indicator 112 for proper system operation.

A localized heater controller or the test system 100 can include the front panel 109 and the back panel. The front panel 109 can include the PID loop controller 110, the temperature indicator 112, a normal system indicator light 114, a silence system indicator light 116, an alarm system indicator light 118, a silence switch 120, and a reset switch 122. The PID loop controller 110 can include algorithms and control circuits to monitor and maintain a desired temperature profile. During normal operations, the normal system indicator light 114 can be illuminated. The temperature indicator 112 serves as a programmable alarm function for safety purposes.

If silence is enabled via the silence switch 120, then the silence system indicator light 116 can be illuminated. Alarm and safety controls are not affected when silence is enabled as indicated by the silence system indicator light 116. Only an audible signal can be muted. When an over temperature event is detected, the temperature indicator 112 can disable power to the PID loop controller 110 thereby turning off power to the nichrome strip heater via the power outlet. The alarm system indicator light 118 can then be illuminated and the normal system indicator light 114 can be extinguished. Once an alarm condition has been resolved (i.e., over temperature or broken thermocouple), the alarm condition can be reset using the reset switch 122.

Figure 1C:
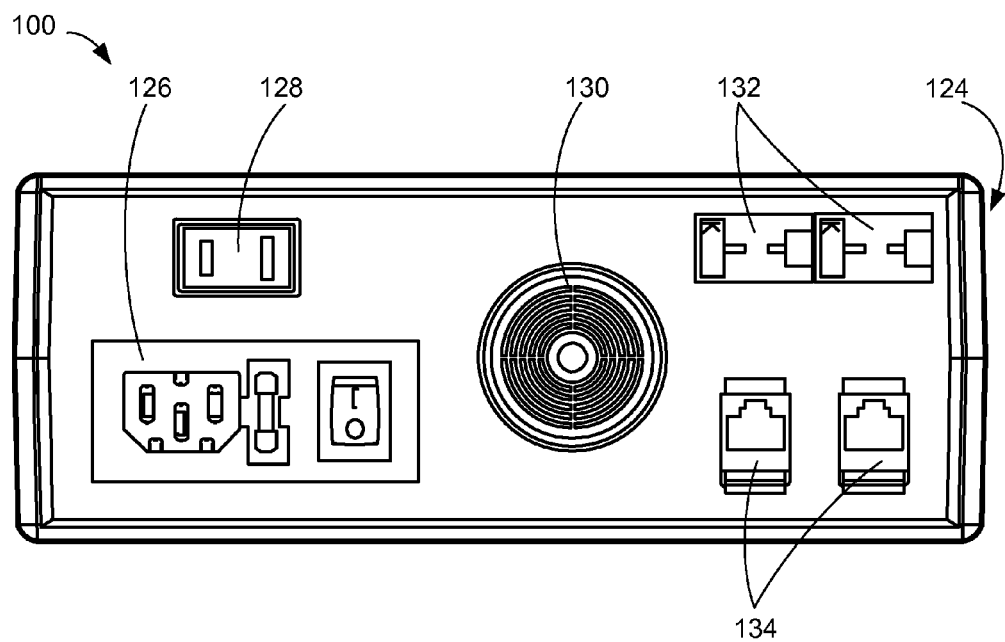
FIG. 1C is an exemplary view of a back panel of the test system.

Referring now to FIG. 1C, therein is shown an exemplary view of a back panel 124 of the test system 100. The back panel 124 can house a power entry module 126, a controlled heater power outlet 128, a peizo element 130 for alarm, a number of thermocouple jacks 132, and a number of network interfaces 134. The front panel 109 of FIG. 1B and the back panel 124 can be housed with custom or specific circuitry to integrate controllers, including the PID loop controller 110 of FIG. 1B and the temperature indicator 112 of FIG. 1B, into the test system 100.

The back panel 124 is the back panel previously described. The controlled heater power outlet 128 is the power jack or the power outlet previously described. The thermocouple jacks 132 are the thermocouple jacks or the back panel connectors previously described.

The back panel 124 can house the electrical interfaces to operate the localized heater oven. The controlled heater power outlet 128 can be controlled by the PID loop controller 110 and additional custom or specific circuits. The power entry module 126 supplies main power entirely for the test system 100. The peizo element 130 provides a method to indicate to the user an audible alarm.

The thermocouple jacks 132 can be matched to the thermocouples from an oven assembly or the localized heater oven. The network interfaces 134 including RJ45 jacks provide a daisy-chained interface to allow a collection of localized heater controllers to be managed by the host computer. For example, the daisy-chained interface can be an RS485 network interface.

Figure 2:
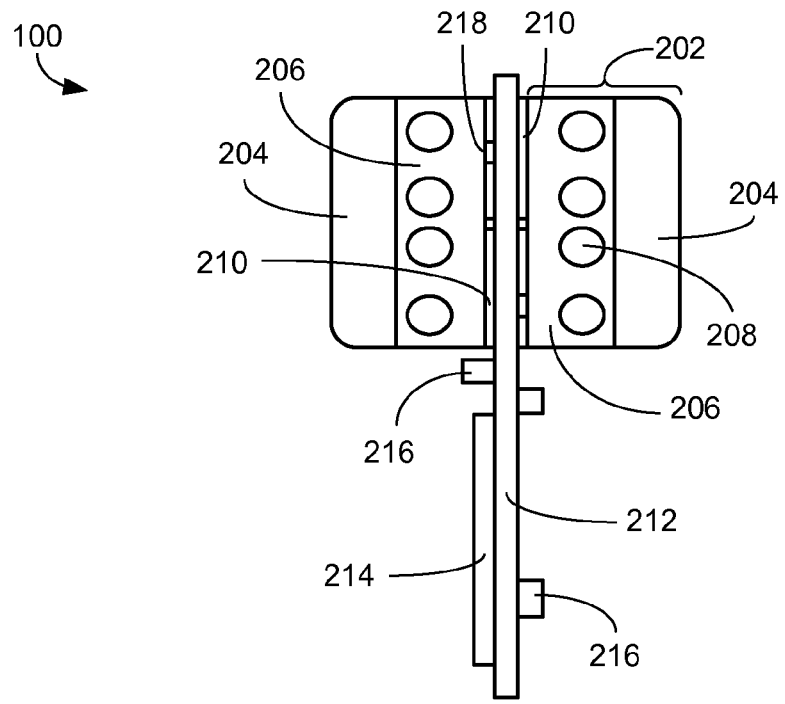
FIG. 2 is an exemplary top view of the test system.

Referring now to FIG. 2, therein is shown an exemplary top view of the test system 100. In at least one embodiment, the test system 100 can include a thermal management head 202, which includes a thermal management element 204, a heat spreader 206, and an aperture 208. The test system 100 can also include an electronic device 210, a substrate 212, a controller 214, and a component 216. In this figure, the electronic device 210 is a target for the localized heater.

Generally, the thermal management element 204 is thermally engaged with the heat spreader 206, such as the heat slug. For example, the thermal management element 204 can be the nichrome strip heater. In such cases, the thermal management element 204 can be in direct contact or on the heat spreader 206. In at least one embodiment, one or more of a plurality of the thermal management element 204 can be located on opposing outer surfaces of the test system 100, outward of the heat spreader 206. It will be appreciated by those skilled in the art that in at least one embodiment, the thermal management element 204 and the heat spreader 206 can be replaced by a Peltier device.

A heating element or the thermal management element 204 can be either a nichrome wire element or a Peltier junction, as an example. The nichrome wire element can be used in industrial process controls and can have about 150 watts (W) typical. Higher wattage elements can be used but the physical size can become difficult to manage. It will be appreciated by those skilled in the art that in at least one embodiment, it is best to select a physically small heating element that has a heating side as flat as possible to ensure even and efficient thermal transfer to the heat spreader 206 including a heat slug. The same rule can be applied to using the Peltier junction in place of a nichrome heating element. At least one embodiment can use one or more Peltier junctions sized to the application for the desired temperature range, physical size, and thermal ramping capabilities.

In accordance with one or more embodiments, the thermal management element 204 can include a material with one or more of the following properties, such as and not limited to high thermal conductivity, high electrical resistance, high mechanical strength, and/or a low coefficient of thermal expansion. In at least one embodiment, the thermal management element 204 can include a metal or ceramic material with high thermal conductivity that is connected to an electrical source.

It will be appreciated by those skilled in the art that the thermal management element 204 can provide a heating function and/or a cooling function for each of the electronic device 210. By way of example, electrical resistance within the thermal management element 204 can provide the energy source for heating and convective currents could provide cooling. In another example, one or more Peltier devices can provide the heating and cooling function by methods and techniques well known within the art.

The heat spreader 206 directly contacts or can be formed on the electronic device 210. By forming the heat spreader 206 in direct contact or on the electronic device 210, a precise, localized and direct heating of the electronic device 210 can occur without heating other structures to the same extremes (e.g., adjacent test equipment or a PCB). In at least one embodiment, one or more of the heat spreader 206 can be located inward (i.e., toward the midline of the test system 100) of the thermal management element 204. Stated another way, the heat spreader 206 can be located between and in direct contact with both the thermal management element 204 and the electronic device 210.

The heat spreader 206 can include any material with a high thermal conductivity and/or a low coefficient of thermal expansion. However, it is to be understood that the heat spreader 206 is not limited to such characteristics and the heat spreader 206 can include any material that effectively transmits thermal energy between the electronic device 210 and the thermal management element 204 and/or the ambient surroundings.

One or more of the aperture 208 can be formed within the heat spreader 206 and can pass partially or entirely through the heat spreader 206. In the illustrated embodiment, the aperture 208 is depicted as round in shape; however, it is not limited to such shape and can include any rectilinear or curvilinear shape. In at least one embodiment, the aperture 208 can provide a cooling effect via convection by introducing a fluid (e.g., air or liquid) through the aperture 208. Moreover, it will be appreciated by those skilled in the art that the aperture 208 can be omitted from the test system 100 design if the thermal transfer requirements do not call for its existence.

In general, FIG. 2 illustrates an apparatus for controlling the temperature of the electronic device 210, such as an integrated circuit, a DUT, or a socket used in the testing of the electronic device 210. In at least one embodiment, the electronic device 210 can include an ASIC (Application Specific Integrated Circuit), a flash device, or a flip-chip device or package. In other embodiments, the electronic device 210 can include any number of integrated circuit devices or packages, such as but not limited to, memory circuits, logic circuits, analog circuits, digital circuits, passive circuits, RF circuits, or a combination thereof, for example. Moreover, it is to be understood that the electronic device 210 described herein can be used within processor components, memory components, logic components, digital components, analog components, mixed-signal components, power components, radio-frequency (RF) components, digital signal processor components, microelectromechanical components, optical sensor components, or a combination thereof, in numerous configurations and arrangements as may be needed.

However, it is to be understood that the preceding examples are not meant to be limiting and the electronic device 210 can include any type of device that requires thermal testing.

In general, the test system 100 can process between one (1) and sixteen (16) of the electronic device 210 at a time. However, it will be appreciated by those skilled in the art that more of the electronic device 210 could be processed at one time if design specifications require.

The electronic device 210 can be mounted on or placed in electrical connection with the substrate 212. Generally, the substrate 212 can include a PCB, a carrier substrate, an interposer, a semiconductor substrate with electrical interconnections, a ceramic substrate, a wafer-level packaging substrate, or a multi-layer structure (e.g., a laminate with one or more conductive layers separated by an insulator) suitable for electrically interconnecting integrated circuit systems formed on, above, and/or in electrical interconnection with the substrate 212 to external electrical circuits. In some embodiments, the substrate 212 can include PCBs commonly used in hard drives or solid state drives. However, the examples provided for the substrate 212 are not to be construed as limiting and the composition of the substrate 212 can include any surface, material, configuration, or thickness that physically and electrically enables the formation or testing of active and/or passive device structures affixed thereto.

In at least one embodiment, one or more of each of the thermal management element 204, the heat spreader 206, and the electronic device 210 can be located on opposing sides of the substrate 212. However, it will be understood that the test system 100 can be practiced with just the thermal management element 204, the heat spreader 206, and the electronic device 210 on one side of the substrate 212.

The substrate 212 can further include the controller 214. The controller 214 can be in electrical connection with the substrate 212, the thermal management element 204, and/or the electronic device 210. In at least one embodiment, the controller 214 can include various interface and control circuits for communication between the test system 100 and external circuits. By way of example, logic circuits and peripheral buses can be commonly employed in the controller 214 electronics.

In some embodiments, the controller 214 can include electronics that bridge a memory structure with a host computer and can perform various functions such as, error correction, read/write caching, and encryption.

In other embodiments, the controller 214 can also include a PID controller for controlling the temperature of the thermal management element 204 and the heat spreader 206, an over temperature power cut off controller, an audible alarm for overheat conditions, and/or high current relays for controlling the thermal management element 204 and the heat spreader 206. In such cases, it will be appreciated by those skilled in the art that a PID controlled system can be very effective at maintaining the desired temperature during steady state operating conditions via a feedback control loop. In general, the PID controller can sample a temperature signal and produce a desired correction signal at least once per second to ensure precise heating of the electronic device 210.

In other embodiments, the controller 214 can include a controller ASIC.

In yet other embodiments, additional circuitry can be added to the controller 214 to latch an alarm condition, to provide an audible alert, to drive panel indicators, to enable alarm silence, and to enable an alarm reset function.

Additionally, the substrate 212 can also include further space for other electronic structures such as the component 216 that can be needed for the operation of the electronic device 210, the substrate 212, and/or the controller 214. Generally, the component 216 can include one or more active devices, passive devices, resistors, capacitors, inductors, filters or a combination thereof, vertically stacked or located within the same plane.

A second component 218 can be in the same category as the component 216. For example, the second component 218 can be a passive device, a semiconductor, or other devices used to operate and/or monitor the heating fixture.

It has been discovered that high temperature testing (e.g., testing in excess of 70° C.) of one or more of the electronic device 210 can achieve a reduction in test duration with the embodiments described herein. For example, with the localized high temperature testing embodiments described herein, high temperature testing can be accelerated by a factor of at least two (2) for every 10° C. increase. Additionally, with the localized high temperature testing embodiments described herein, there is the ability to high temperature test above the manufacturer's specifications to determine new operating limits for ASIC devices. Moreover, with the localized high temperature testing embodiments described herein, one can high temperature test in a finished product while only heating the DUT for both flash and ASIC circuits.

It has also been discovered that faster/higher ramp rates can be used due to the localized high temperature heating embodiments described herein. By way of example and not by limitation, it has been found that ramp rates in excess of seven (7) degrees Celsius per minute are possible since solder joints are not exposed to extreme temperatures. Additionally, such rapid heating and cooling can enable more accurate flash characterization measurements. Typically, conventional ovens cycle at a rate of 2° C. per minute. The statements of this paragraph depend on which embodiments of the present invention we are using. The embodiments referred to in FIG. 4 and FIG. 5 apply here.

It has also been discovered that a reduced bench footprint can be achieved by utilizing the test system 100 described herein. Generally, the perimeter dimensions of the thermal management element 204 and the heat spreader 206 can approximate the boundary dimensions of one or more of the electronic device 210. In at least one embodiment, the test system 100 can test sixteen of the electronic device 210 (using four setups each containing four of the electronic device 210), while only requiring a twelve (12) inch by twelve (12) inch bench space. Conventional ovens typically require a four (4) foot by four (4) foot bench space or footprint.

Figure 3:
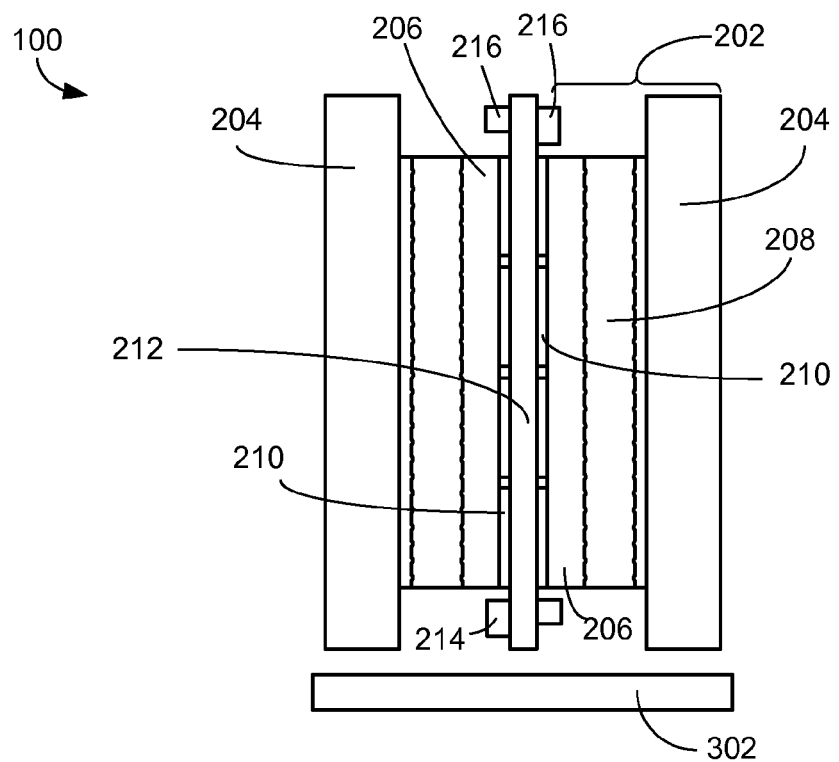
FIG. 3 is an exemplary end view of the test system.
Figure 4:
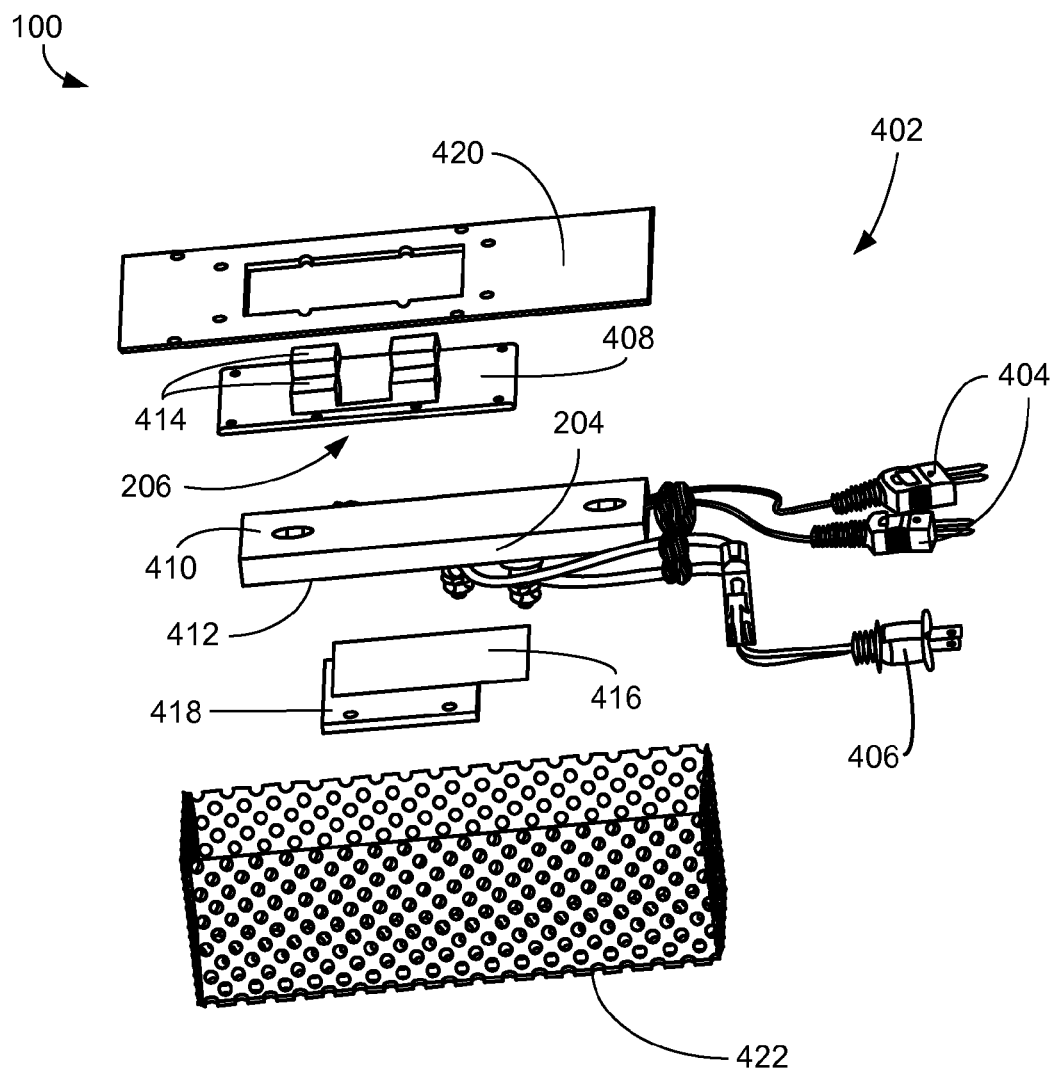
FIG. 4 is an exemplary exploded view of a thermal management head in the test system.
Figure 5:
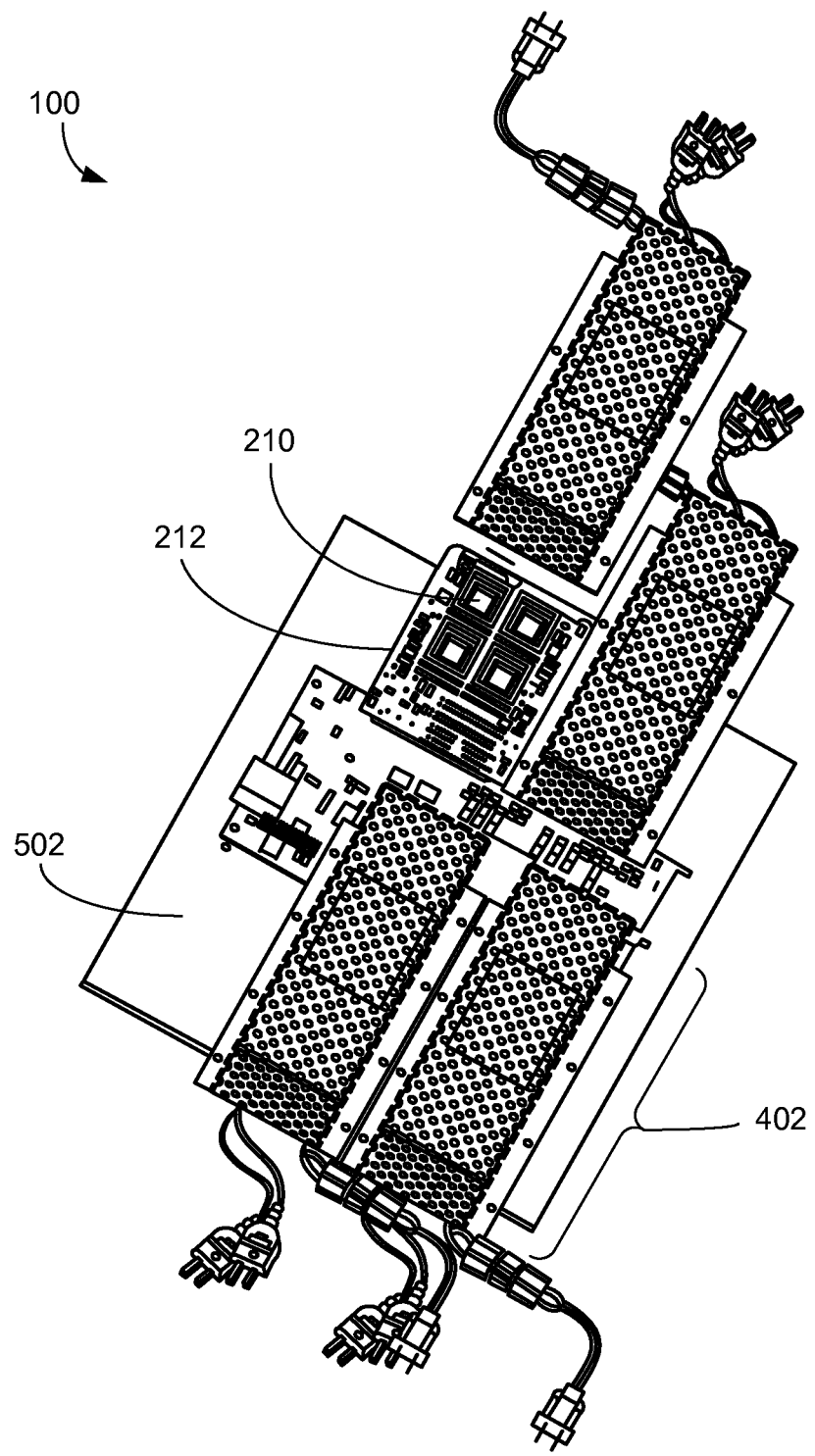
FIG. 5 is an exemplary top view of the test system in a stage of manufacture.

For example, referring to FIG. 2 and FIG. 3, each setup here can test up to 16 DUTs, which can be a typical configuration found on a solid state drive (SSD). Also for example, FIG. 4 and FIG. 5 are shown in an embodiment that can test up to 16 DUTs in sockets instead of directly soldered.

Thus, it has been discovered that the test system 100 of the present invention furnishes important and heretofore unknown and unavailable solutions, capabilities, and functional aspects for localized heating of the electronic device 210.

Referring now to FIG. 3, therein is shown an exemplary end view of the test system 100. In at least one embodiment, the test system 100 can include the thermal management head 202, the thermal management element 204, the heat spreader 206, the aperture 208, the electronic device 210, the substrate 212, the controller 214, and the component 216. In accordance with this embodiment, a driving device 302 can be oriented to move a fluid medium, such as air, through a major or minor axis of the aperture 208 to modulate the temperature within the heat spreader 206. In such cases, the driving device 302 can include a fan.

It has been discovered that the thermal management head 202 helps to protect adjacent test system equipment and any accompanying circuits, structures, and devices from high heat exposure due to the precise, localized heating of the thermal management head 202. As such, the test system and/or the test system equipment remain at a lower temperature during testing, thereby extending the life of the test equipment.

It has also been discovered that the design of the test system 100 permits a reduction in operating cost as compared to traditional test systems. By way of example, the average power consumption by the test system 100 running at 125° C. is 50 Watts, with a peak of 165 Watts. Additional cost savings also result from the test system 100 not requiring a compressed air source.

Thus, it has been discovered that the test system 100 of the present invention furnishes important and heretofore unknown and unavailable solutions, capabilities, and functional aspects for localized heating of the electronic device 210.

Referring now to FIG. 4, therein is shown an exemplary exploded view of a thermal management head 402 in the test system 100. The thermal management head 402 is the thermal management head 102 of FIG. 1. In at least one embodiment, the thermal management head 402 can include the thermal management element 204 with a first surface 410 and a second surface 412 opposing the first surface 410, the heat spreader 206 having projections 414 and a heater mounting surface 408, a sensor 404, a power connector 406, a thermal interface 416, a clamping plate 418, a thermally insulative mounting substrate 420, and a safety cage 422.

In general, the thermal management head 402 can include one or more of the sensor 404 and one or more of the power connector 406. In at least one embodiment, the sensor 404 can include a thermocouple. In such cases, the thermocouple can be located adjacent or on the first surface 410 of the heat spreader 206 or embedded in the heat spreader 206 (i.e., a region adjacent, proximate or in direct contact with the electronic device 210, of FIG. 2) to get as close as possible to the electronic device 210, thereby reducing error. However, it will be appreciated by those skilled in the art that the sensor 404 need not be limited to a thermocouple and can include any apparatus used for measuring heat transfer or temperature.

Further, it will be appreciated by those skilled in the art that temperature control of the test system 100 and/or the thermal management head 402 can be further improved by connecting the sensor 404 to an external PID loop controller. By providing the sensor 404, information can be communicated to the controller 214, of FIG. 2, about the energy transfer between the heat spreader 206 and the electronic device 210. In at least one embodiment, a redundant controller or another of the controller 214 and a redundant sensor or another of the sensor 404 can be added for safety.

In general, the thermal management element 204 is powered by an electrical source or current supplied via the power connector 406; however, the power connector 406 is not to be limited to such a connection and can include any connection that heats or cools the thermal management element 204. It will be appreciated by those skilled in the art that the energy transferred between the heat spreader 206 and the electronic device 210 can be modulated by altering the electrical current supplied to the thermal management element 204 via the power connector 406.

In at least one embodiment, the thermal management element 204 can include any commercially available nickel/chrome wire-based ceramic heating element.

Formed adjacent or in direct contact with the first surface 410 of the thermal management element 204 is the heat spreader 206. In at least one embodiment, the heat spreader 206 can include a small thermal mass thereby enabling quick heating and cooling as required by a flash or ASIC test specification. In some embodiments, the heat spreader 206 can include the projections 414. In such cases, the heat spreader 206 can include four (4) separate rectilinear projections or the projections 414, each configured to directly contact a corresponding one of the electronic device 210. However, it is to be understood that the number and shape of the projections 414 depicted is not limiting and the projections 414 can include any number, size, shape, or pattern as required by the design specifications. In general, each of the projections 414 should be designed or configured to permit the greatest possible surface area contact or interface between the electronic device 210 and the projections 414.

In at least one embodiment, cooling of the heat spreader 206 can be done by convection with the ramp down controlled by a PID controller. It will be appreciated by those skilled in the art that the heat spreader 206 can be designed to allow even heating between adjacent and/or proximate DUTs for greater flash testing accuracy, for example.

Formed around the heat spreader 206 and in contact with the thermal management element 204 is the heater mounting surface 408. The thermal management element 204 can be mounted to the heater mounting surface 408 for mechanical support. In at least one embodiment, the thermally insulative mounting substrate 420 can stop heat from radiating outward from portions of the thermal management element 204 not covered by the heat spreader 206. In such cases, the thermally insulative mounting substrate 420 can include an FR4 substrate; however, the thermally insulative mounting substrate 420 is not to be limited to such a substance and can include any material that retards the dissipation of heat from the thermal management element 204.

Formed adjacent or in direct contact with the second surface 412 of the thermal management element 204 is the thermal interface 416, and formed adjacent or in direct contact with the thermal interface 416 is the clamping plate 418. The thermal interface 416 is the thermal interfaces described above. The thermal interface 416 can include any thermally conductive material and the clamping plate 418 acts as a secondary heat spreader, which can include any material with a high thermal conductivity and/or a low coefficient of thermal expansion. However, it is to be understood that the clamping plate 418 as the second heat spreader is not limited to such characteristics and the clamping plate 418 can include any material that effectively transmits thermal energy. It is also understood that the clamping plate 418 can include fins and projections to dissipate heat more efficiently to enable a more rapid ramp down from higher temperatures. It will be appreciated by those skilled in the art that the thermal management element 204 can be built up with the thermal interface 416 and the clamping plate 418 to help distribute the heat as evenly as possible within the thermal management element 204.

It will be appreciated by those skilled in the art that in at least one embodiment, the clamping plate 418 has two functions. One function is a clamping plate to hold the thermal management element 204 firmly to the heat spreader 206. The other function is that of a heat spreader for efficient ramp down of the thermal management element 204.

In at least one embodiment, the thermal management element 204 can be compressed between the clamping plate 418 and the heat spreader 206. There can be additional thermal interfaces between all heating surfaces to aid in the spreading or efficiency of heat transfer for heating and cooling. The clamping of the thermal management element 204 between the clamping plate 418 and the heat spreader 206 is accurately repeatable and that sub assembly can be mounted on the thermally insulative mounting substrate 420. This assembly technique allows the heating assembly, including the heat spreader 206, the thermal management element 204, and the clamping plate 418, to be easily removed from the thermally insulative mounting substrate 420 if the thermally insulative mounting substrate 420 needs to be replaced. The thermally insulative mounting substrate 420 may need to be replaced depending on the material selected and the target test temperatures.

Generally, the safety cage 422 can enclose the thermal management element 204, a portion of the heat spreader 206, the sensor 404, the power connector 406, the thermally insulative mounting substrate 420, the thermal interface 416, and the clamping plate 418. In such cases, the safety cage 422 can be formed over the thermally insulative mounting substrate 420 for mechanical support. In at least one embodiment, the safety cage 422 can include a mesh-like resilient material or a perforated material for dissipation of heat. In general, the safety cage 422 does not enclose the projections 414.

The safety cage 422 is designed to keep the user from touching the high temperature elements and high voltage connections. All components within and attached to the safety cage are rated for high temperatures. In at least one embodiment, the safety cage 422 can include a pilot lamp to indicate to the user that the heating element is electrically active. In general, the safety cage 422 is designed with appropriate ventilation allowing the thermal management head 402 to cool itself by convection.

In general, the embodiments disclosed herein teach forming the heat spreader 206 as a thermally conductive element in direct contact with the top of the electronic device 210. By forming the heat spreader 206 in direct contact with the electronic device 210, precise localized temperature control of the DUT or of the electronic device 210 can be achieved.

It has been discovered that the thermal management head 402 can provide a low cost, simple heating mechanism. In some embodiments, the equipment cost to test up to four (4) of the electronic device 210 with the thermal management head 402 is about $1,000 US Dollars. In general, the heat spreader 206 can be made to match any open-top style socket, DUT, or electrical device attached to a PCB. In some embodiments, the heat spreader 206 can also be designed to provide precise local heating to the exact size of the electronic device 210, die, or package. In other embodiments, the heat spreader 206 can also be designed to provide precise local heating to a specific area of the electronic device 210, die, or package.

It has been discovered that the thermal management head 402 can provide an improved thermal transfer method and system. By way of example, the localized heat transfer system of the present embodiments improves both DUT-to-DUT temperature variances (i.e., heating is more even between adjacent DUTs) and DUT-to-thermocouple temperature variances (i.e., DUT temperature as measured by the PID controller) because temperatures are more tightly controlled.

Thus, it has been discovered that the localized heat system of the present embodiments furnishes important and heretofore unknown and unavailable solutions, capabilities, and functional aspects for localized heating of devices.

Referring now to FIG. 5, therein is shown an exemplary top view of the test system 100 in a stage of manufacture. FIG. 5 can also be employed for general test usage, method, or system. For example, this figure shows four ovens or four of the thermal management head 402 from FIG. 4 as implemented on a test fixture. The substrate 212 can be electrically connected and/or physically connected to a test system board 502. This embodiment depicts four of the thermal management head 402 in place on top of a test structure or the test system board 502.

Generally, the thermal management head 402 is placed over and in direct contact with each of the electronic device 210. It will be appreciated by those skilled in the art that the test system 100 of the present embodiment depicts a tester wherein up to sixteen of the electronic device 210 can be tested in a 4×4 array or orientation (e.g., a single four (4) unit setup with each unit containing four (4) of the electronic device 210).

It has been discovered that the thermal management head 402 helps to protect the test system board 502 and it accompanying circuits, structures, and devices from high heat exposure. As such, the testing equipment of the test system 100 and/or the test system board 502 remain at a lower temperature during testing, thereby extending the life of the test equipment.

It has also been discovered that the design of the test system 100 permits a reduction in operating cost as compared to traditional tester systems. By way of example, the average power consumption by the test system 100 running at 125° C. is 50 Watts, with a peak of 165 Watts. Additional cost savings also result from the test system 100 not requiring a compressed air source.

Thus, it has been discovered that the test system 100 of the present invention furnishes important and heretofore unknown and unavailable solutions, capabilities, and functional aspects for localized heating of the electronic device 210.

Figure 6:
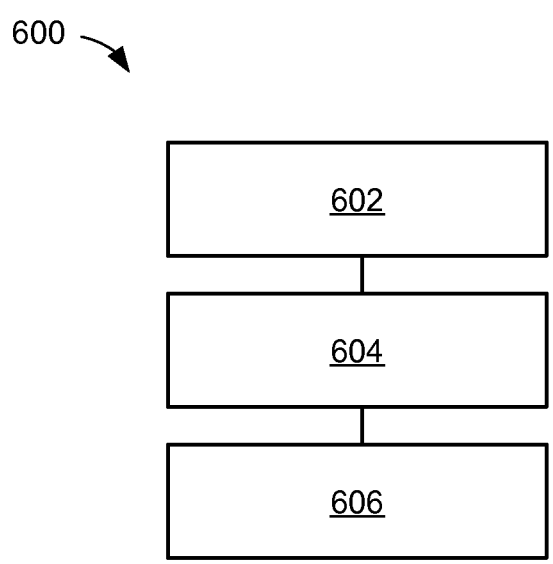
FIG. 6 is a flow chart of a method of manufacture of a test system in a further embodiment of the present invention.

Referring now to FIG. 6, therein is shown a flow chart of a method 600 of manufacture of a test system in a further embodiment of the present invention. The method 600 includes: providing a thermal management head including a heat spreader in a block 602; placing the heat spreader in direct contact with an electronic device in a block 604; and transferring energy between the heat spreader and the electronic device by altering an electrical current in a block 606.

Accordingly, it has been discovered that the present embodiments thus have numerous aspects. One such aspect is that the design of the test system provides a simple, low-cost alternative for localized heating of one (1) to sixteen (16) electronic devices. As such, the test system of the present embodiments costs less than a standard oven typically employed to heat DUTs.

Another aspect of the present embodiments is that the test system described herein is small enough to test components on both sides of a circuit board at the same time at different temperatures.

Another aspect of the present embodiments is that the maximum operating temperature of the test system described herein is only limited by the melting of the solder connection between the electronic device and the PCB or substrate. The solder connection melts due to the heat transfer through the electronic device or integrated circuit from the thermal management head.

Another aspect of the present embodiments is that the minimum operating temperature of the test system described herein is only limited by the heat transfer through the integrated circuit, which causes the solder to break due to cold stress.

Another aspect of the present embodiments is the use of a PID controller to accurately control the temperature and ramp rates of the test system.

Another aspect of the present embodiments is that a user can network up to 240 units, which can be controlled by a single host computer COM port.

Another aspect of the present embodiments is the ability to heat to a temperature above ambient (e.g., up to the temperature limit of the electronic device, the integrated circuit, the DUT, and/or the socket).

Another aspect of the present embodiments is that the design of the test system allows a user to cool the system to a temperature at ambient or with the use of Peltier device, sub-ambient is possible.

Another aspect of the present embodiments is that the localized heating of the test system reduces the occurrence of tester component failure because only the electronic device is heated. The innovative heat spreader design does not heat surrounding components to the electronic device temperature.

Another aspect of the present embodiments is that a redundant controller can be added for safety.

Another aspect of the present embodiments is that the compact design of the test system requires less bench space than a standard oven.

Another aspect of the present embodiments is that a single four (4) unit setup can perform the same experiment at four (4) different, similar or equivalent temperatures at once, providing a complete temperature profile for a given test. Notably, a standard oven can only operate at one temperature.

Another aspect of the present embodiments is that a single four (4)-unit setup consumes less than 600 W peak power, as compared to a standard oven, which uses around 1920 W peak power.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a test system comprising:
providing a thermal management head including a thermal management element, a heat spreader with a plurality of projections, and a thermally insulative mounting substrate, wherein the thermal management element is thermally engaged with the heat spreader and has a portion that is not covered by the heat spreader, and the thermally insulative mounting substrate covers the portion of the thermal management element to stop heat from radiating outward from the portion of the thermal management element;
placing each of the projections in direct contact with a respective electronic device of a plurality of electronic devices; and
transferring heat from the plurality of projections to the plurality of electronic devices by supplying an electrical current to the thermal management head.

2. The method as claimed in claim 1 further comprising heating at least one electronic device of the plurality of electronic devices at a ramp rate of at least seven degrees Celsius per minute.

3. The method as claimed in claim 1 further comprising providing a proportional-integral-derivative (PID) controller, and a sensor for communicating information about the heat transfer between the heat spreader and the plurality of electronic devices to the PID controller for controlling the temperature of the plurality of electronic devices.

4. The method as claimed in claim 1 wherein the thermal management element includes a Peltier device.

5. The method as claimed in claim 1 wherein placing the plurality of projections in direct contact with the plurality of electronic devices includes placing the plurality of projections in direct contact with a plurality of integrated circuits, a plurality of devices under test, or a plurality of sockets.

6. The method as claimed in claim 1 wherein each of the respective electronic devices is on a substrate.

7. The method as claimed in claim 1 further comprises testing the plurality of electronic devices by heating or cooling the plurality of electronic devices.

8. The method as claimed in claim 1
further comprising placing the thermal management element in contact with the heat spreader.

9. The method as claimed in claim 1 wherein the heat spreader includes an aperture.

10. A test system comprising:
a thermal management head including a thermal management element, a heat spreader with a plurality of projections, and a thermally insulative mounting substrate, wherein the thermal management element is thermally engaged with the heat spreader and has a portion that is not covered by the heat spreader, and the thermally insulative mounting substrate covers the portion of the thermal management element to stop heat from radiating outward from the portion of the thermal management element;

wherein the plurality of projections are configured to directly contact respective electronic devices of a plurality of electronic devices; and a power connector to provide an electrical current for transferring heat from the plurality of projections to the plurality of electronic devices.

11. The system as claimed in claim 10 wherein the thermal management element is in contact with the heat spreader.

12. The system as claimed in claim 10 wherein the heat spreader includes an aperture.

13. The system as claimed in claim 10 further comprising a proportional-integral-derivative (PID) controller, and a sensor for communicating information about the heat transfer between the heat spreader and the plurality of electronic devices to the PID controller for controlling the temperature of the plurality of electronic devices.

14. The system as claimed in claim 10 wherein each electronic device of the plurality of electronic devices is on a substrate.

15. The system as claimed in claim 10 wherein the plurality of electronic devices includes a plurality of integrated circuits, a plurality of devices under test, or a plurality of sockets.

16. The system as claimed in claim 10 wherein the thermal management head is further configured to cool the plurality of electronic devices.

17. The system as claimed in claim 10 wherein the thermal management element includes a Peltier device.

18. The system as claimed in claim 10 wherein at least one electronic device of the plurality of electronic devices is heated at a ramp rate of at least seven degrees Celsius per minute.

* * * * *